(12) United States Patent
Breunig et al.

(10) Patent No.: US 11,933,819 B2
(45) Date of Patent: Mar. 19, 2024

(54) SIGNAL PROCESSING DEVICE AS WELL AS METHOD OF APPLYING A ZONE TRIGGER

(71) Applicant: Rohde & Schwarz GmbH & Co. KG, Munich (DE)

(72) Inventors: Markus Breunig, Munich (DE); Mirko Soellner, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 231 days.

(21) Appl. No.: 16/146,962

(22) Filed: Sep. 28, 2018

(65) Prior Publication Data
US 2020/0103443 A1 Apr. 2, 2020

(51) Int. Cl.
*G01R 13/02* (2006.01)
*G01R 23/16* (2006.01)
*G01R 29/02* (2006.01)

(52) U.S. Cl.
CPC ....... *G01R 13/0254* (2013.01); *G01R 29/023* (2013.01); *G01R 23/16* (2013.01)

(58) Field of Classification Search
None
See application file for complete search history.

(56) References Cited

U.S. PATENT DOCUMENTS

| | | | | |
|---|---|---|---|---|
| 6,947,043 B1* | 9/2005 | Klingman | ............ | G01R 13/345 345/440.1 |
| 9,506,951 B2* | 11/2016 | Taratorin | ............ | G01R 13/029 |
| 10,024,895 B1* | 7/2018 | Melis | ................. | G01R 13/0254 |
| 10,261,111 B1* | 4/2019 | Mattson | ............ | G01R 13/0254 |
| 2007/0282542 A1* | 12/2007 | Duff | .................... | G01R 13/0254 702/35 |
| 2014/0142880 A1* | 5/2014 | Dobyns | ................ | G01R 23/165 702/76 |
| 2014/0236539 A1* | 8/2014 | Lehane | .................. | G06F 17/00 702/190 |

(Continued)

FOREIGN PATENT DOCUMENTS

EP 2418498 A2 2/2012

OTHER PUBLICATIONS

Keysight Technologies, "Triggering on Infrequent Anomalies and Complex Signals using Zone Trigger," Dec. 1, 2017, downloaded from https://f.hubspotusercontent40.net/hubfs/281197/Keysight_Zone-Triggering_AppNote_CControls.pdf on Jul. 19, 2022. (Year: 2017).*

*Primary Examiner* — Kyle R Quigley
*Assistant Examiner* — Denise R Karavias
(74) *Attorney, Agent, or Firm* — CHRISTENSEN O'CONNOR JOHNSON KINDNESS PLLC

(57) ABSTRACT

A signal processing device is described, with a signal input for receiving an input signal, a first trigger unit generating a trigger signal based upon a first trigger event in the input signal and an acquisition memory for acquiring the input signal at least based upon the trigger signal so as to provide an acquired signal. The signal processing device also comprises a second trigger unit connected to the acquisition memory. The second trigger unit is adapted to process the acquired signal according to a second trigger. The second trigger unit is adapted as a zone trigger unit applying a zone trigger. Further, a method of applying a zone trigger is described.

13 Claims, 1 Drawing Sheet

(56) References Cited

U.S. PATENT DOCUMENTS

| | | | |
|---|---|---|---|
| 2015/0293170 A1* | 10/2015 | Knierim | G01R 31/28 |
| | | | 702/124 |
| 2015/0301086 A1* | 10/2015 | Schaefer | G01R 13/0263 |
| | | | 324/76.13 |
| 2016/0299181 A1* | 10/2016 | Reich | G01R 13/0263 |
| 2017/0138992 A1 | 5/2017 | Bresser et al. | |
| 2017/0201239 A1* | 7/2017 | Smith | H03K 3/037 |
| 2019/0049488 A1* | 2/2019 | Herbordt | G01R 13/0254 |

\* cited by examiner

SIGNAL PROCESSING DEVICE AS WELL AS METHOD OF APPLYING A ZONE TRIGGER

FIELD OF THE DISCLOSURE

Embodiments of the present disclosure relate generally to a signal processing device. Further, embodiments of the present disclosure relate generally to a method of applying a zone trigger.

BACKGROUND

In modern signal processing devices such as an oscilloscope or a spectrum analyzer, different triggers are typically used when data of a certain input signal shall be acquired so that only those signals are stored in an acquisition memory that fulfill the respective condition applied by the trigger. In other words, a trigger unit that is used for applying the respective trigger is located upstream of the acquisition memory so that the trigger signal forwarded to the acquisition memory is assigned to a trigger event corresponding to the trigger applied.

A specific trigger is a so-called zone trigger that is used as a second trigger stage behind a first trigger stage established by a conventional trigger such as an edge trigger, a level trigger, a slope trigger and so on. Hence, certain events are selected by the first trigger stage wherein the analysis is improved further by applying the zone trigger.

The zone trigger generally enables the graphical separation of events in the time and frequency domain. Accordingly, the zone trigger works in both time and frequency domain. For applying the zone trigger, a user typically sets a user-defined zone by simply drawing a zone on a display of the respective signal processing device so as to indicate the respective zone trigger, for instance. Thus, the user-defined zone corresponds to axis ranges in two dimensions, namely a first axis range and a second axis range. The user further defines whether or not the waveform displayed shall intersect the zone drawn or not so that data is only acquired that relates to the respective zone defined or not, respectively. Accordingly, the zone trigger corresponds to a graphical trigger.

However, the zone trigger applied corresponds to a post-processing technique of the already triggered signal so that the acquisition rate of the input signal is decreased due to the zone trigger applied. In addition, the blind time between two records is increased due to the acquisition rate decreased. This may result in an acquired signal in which trigger events are missed due to the respective zone trigger applied. Thus, the zone trigger is typically applied for periodic signals so as to minimize the risk of missing trigger events.

Accordingly, there is a need for a signal processing device as well as a method of applying a zone trigger that ensures an increase to the acquisition rate.

SUMMARY

Embodiments of the present disclosure provide a signal processing device having: a signal input for receiving an input signal, a first trigger unit generating a trigger signal based upon a first trigger event in the input signal, an acquisition memory for acquiring the input signal at least based upon the trigger signal so as to provide an acquired signal, and a second trigger unit connected to the acquisition memory. The second trigger unit in some embodiments being adapted to process the acquired signal according to a second trigger, wherein the second trigger unit is adapted as a zone trigger unit applying a zone trigger.

Further, embodiments of the present disclosure provide a method of applying a zone trigger with the following steps: receiving an input signal via a signal processing device, applying a first trigger on the input signal via a first trigger unit, generating a trigger signal at least based upon a first trigger event in the input signal, acquiring the input signal at least based upon the trigger signal so as to provide an acquired signal, applying a zone trigger on the acquired signal via a second trigger unit, and generating a pre-processed signal at least based upon a second trigger event in the acquired signal.

Accordingly, the second trigger unit applies a zone trigger on the acquired data or rather the acquired signal so that the acquired signal stored in the acquisition memory can be filtered later with regard to the respective zone set by a user of the signal processing device. In other words, the acquired signal is filtered according to a second trigger event in the acquired signal. Thus, only those acquired signal(s) are output or rather post-processed that fulfill the respective trigger condition of the zone trigger. For setting the zone trigger, the user may simply draw a zone on a display unit of the respective signal processing device. Since the zone trigger is applied on the already acquired data, it is ensured that the input signal can be acquired with a maximum acquisition rate since the acquisition rate is not decreased by the zone trigger applied prior to the acquisition. This ensures that no trigger events are missed as the blind time of the acquisition is minimized.

In general, the zone trigger, namely the respective filtering of the acquired signal, may be used for error analysis and/or evaluation of the input signal quality at a later processing stage, for example, a post-processing stage.

According to an aspect, the zone trigger applied on the acquired data is adaptable. Thus, the zone trigger can be adapted easily and effectively without any negative influence on the acquisition of the input signal since the zone trigger is applied on data already acquired. In other words, the zone trigger can be adapted since it is applied on historical data stored in the acquisition memory. Hence, the condition of the zone trigger can be adapted frequently without losing any data acquired or rather without the necessity to restart the acquisition.

According to another aspect, the second trigger unit is located downstream of the acquisition memory. Thus, the second trigger unit is applied on signal(s) originating from the acquisition memory, namely the acquired signal(s).

The acquired signal may be assigned to acquisition data. The acquisition data relates to historical data of the input signal, for example, data already acquired due to the trigger signal provided by the first trigger unit. Therefore, it is possible to adapt the settings or rather conditions of the zone trigger applied by the second trigger unit in a desired manner without impairing the acquisition of the input signal, in particular the acquisition rate.

According to another aspect, the acquired signal comprises signal tuples each having a first axis value and a second axis value. Thus, it is possible to trigger graphically based on the respective signal tuples or rather data tuples by simply drawing a certain zone on the display unit. The zone drawn is defined by at least a first axis range and at least a second axis range. Thus, the zone drawn assigned to the trigger zone is a two-dimensional zone having limits in both dimensions, for example, two limits for the x-axis and y-axis each. In some embodiments, the zone corresponds to a rectangular. The second trigger unit verifies whether or not the respective signal tuple or rather data tuple lies within the first and second axis ranges set while applying the second trigger.

Thus, the acquisition data, namely the acquired data, may relate to data tuples each having at least a first axis value and at least a second axis value.

For instance, the first axis value is time or frequency. The respective diagram, which is illustrated by the display unit and which is used for graphical triggering, for example, setting the zone trigger, may illustrate a graph or rather signal that depends on time or frequency.

The second axis value may be amplitude. Thus, the amplitude over frequency or rather the amplitude over time may be displayed on a display unit of the signal processing device wherein the respective zone trigger is set appropriately by drawing a certain zone on the display unit. Thus, the respective zone trigger set can be applied appropriately wherein the second trigger unit verifies whether or not the acquired signal has at least portions or rather data tuples intersecting the zone set.

In addition, the second trigger may comprise at least a first axis range and at least a second axis range. Thus, the second trigger, namely the zone trigger, corresponds to a certain area or rather zone of the graphically illustrated data defined by the respective ranges. Typically, the zone set by the user as the trigger zone corresponds to, for example, a rectangular having a range in both axes respectively.

Any second trigger event in the acquired signal may fall within the zone or rather second trigger comprising at least a first axis range and at least a second axis range.

According to an embodiment, the signal processing device comprises a third trigger unit. Thus, several trigger units are used for processing the input signal by the signal processing device in an appropriate manner. In other words, the signal processing device may have several trigger stages applied, and in some embodiments, at least two trigger stages used prior to the acquisition of the input signal.

For instance, the third trigger unit is located between the first trigger unit and the acquisition memory. Thus, the third trigger corresponds to a second trigger stage with regard to the first trigger unit corresponding to a first trigger stage. The trigger stages are applied prior to the acquisition of the input signal. In other words, the third trigger unit may apply a (third) trigger on the signal output by the first trigger unit. Thus, the trigger signal forwarded to the acquisition memory for acquisition is triggered twice, for example, by applying the (first) trigger of the first trigger unit as well as the (third) trigger of the third trigger unit.

According to an aspect, the third trigger unit may also be adapted as a zone trigger unit applying a zone trigger. Thus, a zone trigger is applied prior to the acquisition of the respective input signal. Hence, the acquired data may be preselected or rather pre-filtered by applying the zone trigger of the third trigger unit. In some embodiments, the zone trigger of the third trigger unit may relate to a larger zone compared to the zone trigger applied by the second trigger unit such that a rough pre-filtering is applied so as to reduce the required storage capacity of the acquisition memory.

Moreover, the signal processing device may comprise at least one post-processing unit. In fact, the signal processing device may comprise several post-processing units. The at least one post-processing unit may relate to a measurement unit, a display unit and/or an analysis unit. In some embodiments, post-processing unit may be implemented in hardware, in software, or combinations thereof.

The post-processing unit in some embodiments may be located downstream of the second trigger unit. Thus, the post-processing unit receives the pre-processed signal that is output by the second trigger unit for post-processing such as performing measurements, performing analyses or simply displaying the respective data.

In other words, a certain measurement or rather analysis may be done provided that the at least one post-processing unit is established by a measurement unit or rather an analysis unit. Alternatively or additionally, the pre-processed signal may be directly displayed by the post-processing unit established by a display unit. Thus, the post-processing unit converts the pre-processed signal so as to obtain data that can be visualized.

Moreover, the second trigger unit in some embodiments may be located between the acquisition memory and the post processing unit. Hence, the already acquired data is filtered by the second trigger unit while applying the zone filter on the acquired signal. The filtered data or rather the filtered signal, for example, the pre-processed signal, is forwarded to the post-processing unit for post-processing the pre-processed signal in an appropriate manner.

For instance, the first trigger event is assigned to a particular physical signal feature. The physical signal feature may be taken into account by applying a conventional trigger, for instance an edge trigger such as a rising edge trigger, a falling edge trigger or rather a threshold trigger.

Furthermore, the first trigger event may be assigned to at least one of frequency, amplitude, phase and/or pulse width. Thus, physical signal features of the input signal are used by the first trigger unit.

In some embodiments, the signal processing device is at least one of a spectrum analyzer or an oscilloscope. Thus, different signal processing devices may be used for applying the zone trigger on the historical or rather acquired data so as to ensure a high acquisition rate of the input signal which results in a minimized blind time during the acquisition.

According to an aspect, the zone trigger applied on the acquired data is adaptable. Thus, the zone trigger can be adapted easily and effectively without any negative influence on the acquisition since the zone trigger is applied on data already acquired. Thus, the condition used by the zone trigger can be adapted frequently without losing any data acquired or rather without the necessity to restart the acquisition of the input signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
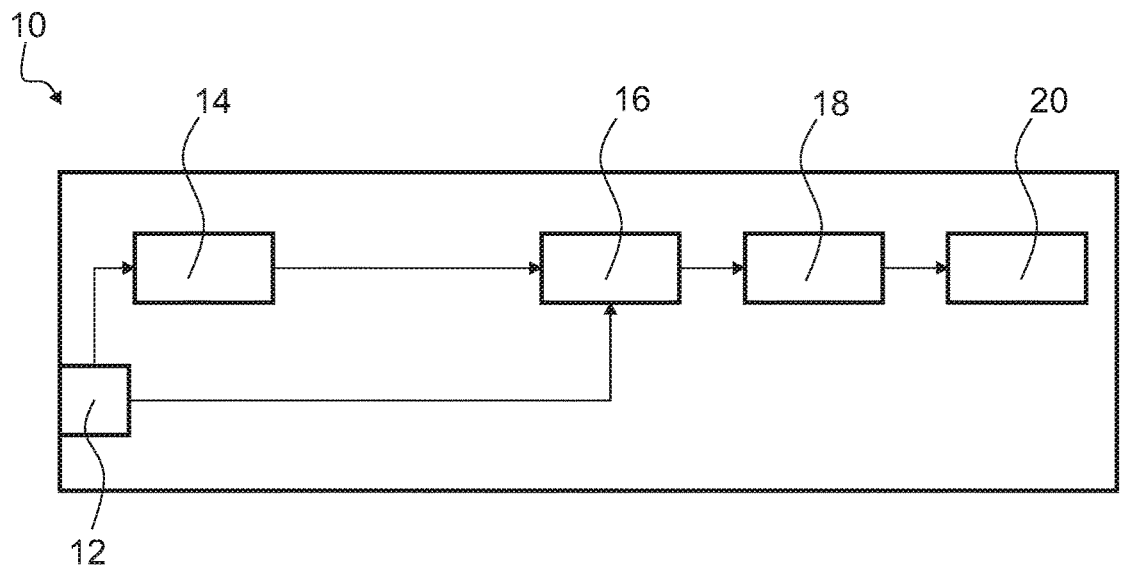
FIG. 1 schematically shows an overview of a signal processing device according to an aspect of the present disclosure.

In FIG. 1, a signal processing device 10 is shown with a signal input 12 for receiving an input signal. The input signal may be probed so that the signal input 12 is assigned to a probe. The signal input 12 is connected with a first trigger unit 14 as well as an acquisition memory 16.

The first trigger unit 14 is generally configured to generate a trigger signal based upon a first trigger event in the input signal. The trigger signal generated is forwarded to the acquisition memory 16 that is also connected to the first trigger unit 14.

Once the acquisition memory 16 receives the trigger signal generated by the first trigger unit 14, the input signal is acquired and stored in the acquisition memory 16. Hence, an acquired signal or rather acquisition data is generated. Accordingly, the acquisition memory 16 is configured to acquire the input signal at least based upon the trigger signal.

In some embodiments, the signal processing device 10 also comprises a second trigger unit 18 that is connected to the acquisition memory 16. As shown in the embodiment of FIG. 1, the second trigger unit 18 is located downstream of the acquisition memory 16. Thus, the acquisition memory 16 is located between the first trigger unit 14 and the second trigger unit 18. This means that the first trigger unit 14 corresponds to a pre-acquisition trigger unit whereas the second trigger unit 18 corresponds to a post-acquisition trigger unit.

Therefore, the second trigger unit 18 is adapted to process the acquired signal according to a second trigger. In other words, the second trigger unit 18 applies a trigger for a second trigger event in the acquired signal. Put another way, the second trigger unit 18 receives the acquired signal from the acquisition memory 16 and generates a pre-processed signal at least based upon a second trigger event in the acquired signal processed by the second trigger unit 18. In general, the second trigger unit 18 is adapted as a zone trigger unit as will be described with regard to FIG. 2.

The signal processing device 10 further includes at least one post-processing unit 20 that is connected to the second trigger unit 18 so as to receive the pre-processed signal output by the second trigger unit 18 after having applied the second trigger, namely the zone trigger.

The at least one post-processing unit 20 in some embodiments may be a measurement unit, a display unit and/or an analyzing unit. Therefore, the pre-processed signal forwarded to the at least one post-processing unit 20 can be post-processed appropriately. Provided that the post-processing unit 20 is a measurement and/or analyzing unit, the respective pre-processed signal can be measured and/or analyzed. Moreover, the pre-processed signal or rather a certain portion thereof, for instance at least one data tuple, may be visualized by the post-processing unit 20 that is established by the display unit. The functionality of the post-processing unit 20 can be carried out in hardware or in software or in a combination of hardware and software. For example, the post-processing unit 20 in some embodiments may include digital circuits, analog circuits, programmed processors, SoCs, FPGAs, ASICs, etc., and/or combinations thereof.

Since the zone trigger provided by the second trigger unit 18 is applied on the acquired data or rather the acquired signal, it is ensured that the acquisition rate can be maximized so that any blind time(s) is/are minimized. This ensures that trigger events will not be missed due to blind time(s) during the acquisition of the input signal. In addition, the zone trigger is applied on the already acquired data so that the respective zone trigger can be adapted without any influence on the acquisition of the data/signal since this has already been done previously. In other words, the acquired signal that is forwarded to the second trigger unit 18 corresponds to acquisition data or historical data that has already been acquired.

In some embodiments, the acquired signal stored in the acquisition memory 16 comprises signal tuples each having a first axis value and a second axis value. For instance, the first axis values relate to time or frequency whereas the second axis values may relate to amplitude. Hence, the signal tuples relate to data corresponding to amplitude over time or rather amplitude over frequency.

In contrast to the second trigger unit 18 assigned to the zone trigger, the first trigger unit 14 is assigned to a particular physical signal feature, for instance frequency, amplitude, phase and/or pulse width. Thus, the first trigger unit 14 corresponds to a conventional trigger unit assigned to an edge trigger such as a rising edge trigger, a falling edge, a level trigger, a threshold trigger, a slope trigger and so on.

In the flow-chart shown in FIG. 2, a method of applying a zone trigger is illustrated appropriately to which reference is made hereinafter. In a first step S1, the signal processing device 10 receives via its signal input 12 an input signal. In a second step S2, the input signal is forwarded to the first trigger unit 14 that applies a first trigger on the input signal, namely a conventional trigger on a particular physical signal feature, for instance frequency, amplitude, phase and/or pulse width. The first trigger may correspond to an edge trigger such as a rising edge trigger, a falling edge, a level trigger, a threshold trigger, a slope trigger and so on. In a third step S3, a trigger signal is generated at least based upon a first trigger event in the input signal.

In a fourth step S4, the trigger signal generated is forwarded to the acquisition memory 16. In a fifth step S5, the input signal is acquired by the acquisition memory 16 at least based upon the trigger signal received so as to provide an acquired signal. The acquired signal corresponds to acquired data that is stored in the acquisition memory 16. In a sixth step S6, the zone trigger is applied on the acquired signal via the second trigger unit 18 so as to generate a pre-processed signal based upon a second trigger event in the acquired signal.

Since the second trigger unit 18 is adapted as a zone trigger unit, the acquired signal stored in the acquisition memory 16 can be filtered after its acquisition with regard to the respective zone set by the user of the signal processing device 10.

Thus, only those acquired signal(s) are analyzed afterwards that fulfill the respective trigger condition applied by the zone trigger. For setting the zone trigger, the user simply draws a zone on the post-processing unit 20, for example, the display unit, so as to define the respective zone used by the zone trigger.

Hence, the second trigger, namely the zone trigger applied, comprises at least a first axis range and at least a second axis range. In other words, a two dimensional zone is set which may be intersected for fulfilling the respective trigger condition. In some embodiments, the zone corresponds to a rectangular.

Since the zone trigger is applied on the already acquired data, it is ensured that the input signal can be acquired with a maximum acquisition rate since the zone trigger does not disturb the acquisition, for example, slowing down the acquisition. This ensures that no trigger events are missed as the blind time is minimized.

In a seventh step S7, the pre-processed signal is post-processed by the at least one post-processing unit 20 so that a certain measurement and/or analysis is done by the post-processing unit 20 provided that the at least one post-processing unit 20 is established by a measurement and/or analysis unit. Alternatively or supplementary, the respective information is displayed via a display used as the at least one post-processing unit 20.

Figure 3:
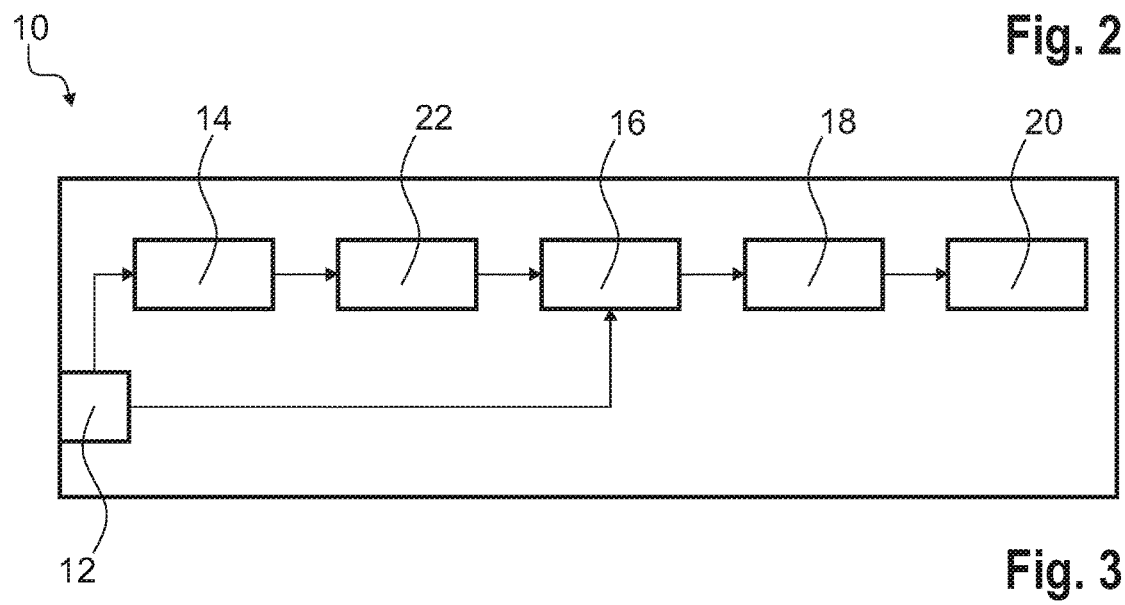
FIG. 3 schematically shows an overview of a signal processing device according to another aspect of the present disclosure.

In FIG. 3, the signal processing device 10 is shown in an alternative configuration since a third trigger unit 22 is provided that is located upstream of the acquisition memory 16. In some embodiments, the third trigger unit 22 is located between the first trigger unit 14 and the acquisition memory 16. Hence, the third trigger unit 22 applies a trigger signal on the signal received from the first trigger unit 14. The third trigger unit 22 in some embodiments may also be adapted as a zone trigger unit so that a zone trigger is applied on the signal output by the first trigger unit 14.

In some embodiments, a two-stage triggering is provided by the first trigger unit 14 and the subsequent third trigger unit 22 prior to the acquisition wherein the trigger units 14, 22 together provide a trigger signal that is forwarded to the acquisition memory 16 for acquiring the input signal.

In some embodiments, the acquisition memory 16 receives the trigger signal that has been triggered by the first trigger unit 14 as well as the third trigger unit 22 so that only input signals are acquired fulfilling both trigger conditions. The second trigger unit 18 adapted as the zone trigger is still located downstream of the acquisition memory 16 so that the respective zone trigger is applied on the historical acquisition data that has been acquired previously.

Hence, the zone trigger applied by the third trigger unit 22 may be broader than the zone trigger applied by the second trigger unit 18 so that the zone trigger applied by the third trigger unit 22 corresponds to a pre-filtering ensuring that no trigger events are missed whereas the zone trigger applied by the second trigger unit 18 is used for investigating the acquired signal in greater detail.

Figure 2:
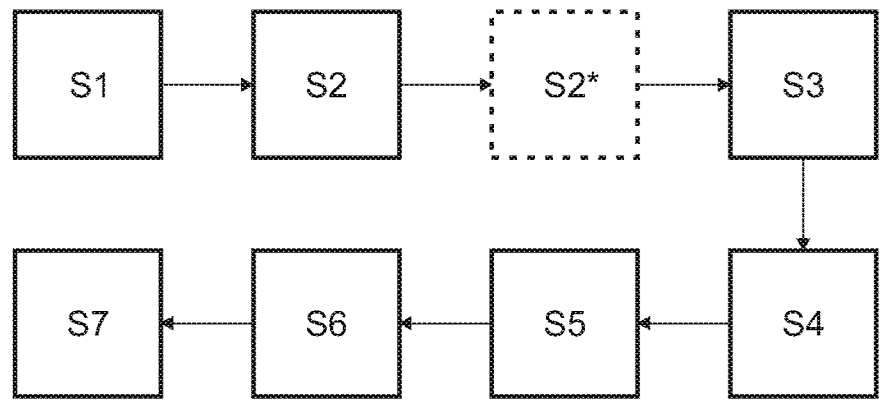
FIG. 2 schematically shows a flow-chart illustrating an example of a method according to an aspect of the present disclosure.

The respective zone trigger may be applied by the third trigger unit 22 in an intermediate step S2* after the second step S2 as indicated in FIG. 2 by the dashed box. Accordingly, the acquisition rate can be increased since the detailed zone trigger is applied on the already acquired signal.

Further, it is possible to change the condition of the zone trigger applied without any impact on the acquisition since the zone trigger provided by the second trigger unit 18 is applied on the acquired data. Hence, it is not necessary to interrupt the acquisition of the input signal while adapting the condition of the respective zone trigger.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal processing device comprising:
a signal input for receiving an input signal;
a first trigger unit configured to generate a trigger signal based upon a first trigger event in the input signal;
an acquisition memory for acquiring the input signal at least based upon the trigger signal so as to provide an acquired signal, the acquired signal being assigned to acquisition data stored in the acquisition memory;
a second trigger unit connected to the acquisition memory, said second trigger unit being adapted as a zone trigger unit applying a zone trigger;
at least one post-processing unit that relates to a measurement unit or an analysis unit; and
a display unit,
wherein the acquisition memory is located between the first trigger unit and the second trigger unit such that the second trigger unit located downstream of the acquisition memory is located between the acquisition memory and the at least one post processing unit,
wherein an input of the second trigger unit is directly connected to an output of the acquisition memory,
wherein an input of the at least one post-processing unit is directly connected to an output of said second trigger unit,
wherein said second trigger unit is adapted to receive the acquired signal from the acquisition memory and to process the acquired signal according to the zone trigger, the zone trigger being applied on the acquired signal originating from the acquisition memory such that the acquired signal is filtered according to a second trigger event in the acquired signal, wherein the second trigger unit is also adapted to generate a pre-processed signal that is forwarded to the at least one post-processing unit such that only those acquired signals are post-processed that fulfill the trigger condition of the zone trigger,
wherein the at least one post-processing unit directly receives the pre-processed signal that is output by the second trigger unit,
wherein no output from said second trigger unit is provided to the acquisition memory, said second trigger unit being configured to not affect the acquisition data stored in the acquisition memory and second trigger unit being configured to filter the acquired signal according to the second trigger event in the acquired signal such that only those acquired signals are post-processed by the at least one post-processing unit, which fulfill the trigger condition of the zone trigger,
wherein the acquired signal comprises signal tuples each having a first axis value and a second axis value, the first axis value being time or frequency, the second axis value being amplitude, and
wherein the zone trigger comprises the first axis range and the second axis range, the first axis range being associated with time or frequency, the second axis range being associated with amplitude, wherein said second trigger unit verifies whether or not the respective signal tuples lie within the first and second axis ranges set while applying the second trigger.

2. The signal processing device according to claim 1, wherein the zone trigger applied on the acquired signal is adaptable.

3. The signal processing device according to claim 1, wherein the signal processing device comprises a third trigger unit.

4. The signal processing device according to claim 3, wherein the third trigger unit is located between the first trigger unit and the acquisition memory.

5. The signal processing device according to claim 3, wherein the third trigger unit is also adapted as a zone trigger unit applying a zone trigger.

6. The signal processing device according to claim 1, wherein said post-processing unit is located downstream of the second trigger unit.

7. The signal processing device according to claim 1, wherein the first trigger event is assigned to a particular physical signal feature.

8. The signal processing device according to claim 1, wherein the first trigger event is assigned to at least one of frequency, amplitude, phase or pulse width.

9. The signal processing device according to claim 1, wherein said signal processing device is at least one of a spectrum analyzer or an oscilloscope.

10. A method of applying a zone trigger, comprising:
receiving an input signal via a signal processing device;
applying a first trigger on the input signal via a first trigger unit;
generating a trigger signal at least based upon a first trigger event in the input signal;
acquiring the input signal at least based upon the trigger signal so as to provide an acquired signal that comprises signal tuples each having a first axis value and a second axis value, the first axis value being time or frequency, the second axis value being amplitude, the acquired signal being assigned to acquisition data stored in the acquisition memory;
receiving, by an input of a second trigger unit directly connected to an output of the acquisition memory, the acquired signal from the acquisition memory;
processing, by the second trigger unit, the acquired signal according to the zone trigger by applying a zone trigger on the acquired signal, a user drawing a zone on a display unit of the signal processing device for setting the zone trigger, the zone drawn being defined by a first axis range and a second axis range such that the zone drawn corresponds to a rectangular, wherein the zone trigger applied comprises the first axis range and the second axis range, the first axis range being associated with time or frequency, the second axis range being associated with amplitude, wherein the second trigger unit verifies whether or not the respective signal tuples lie within the first and second axis ranges set while applying the second trigger;
generating, by the second trigger unit, a pre-processed signal at least based upon a second trigger event in the acquired signal; and
outputting, by an output of the second trigger unit directly connected to an input of a post-processing unit, the pre-processed signal,
receiving and post-processing, by the post-processing unit that relates to a measurement unit or an analysis unit, the pre-processed signal that is output by the second trigger unit such that a measurement or an analysis is done on the pre-processed signal by the post-processing unit,
wherein no output from said second trigger unit is provided to the acquisition memory, said second trigger unit being configured to not affect the acquisition data stored in the acquisition memory, and wherein the acquired signal is filtered according to the second trigger event in the acquired signal such that only those acquired signals are post-processed that fulfill the trigger condition of the zone trigger, and
wherein the zone trigger is used for error analysis and/or evaluation of the input signal quality at a subsequent processing stage.

11. The method according to claim 10, wherein the zone trigger applied on the acquired signal is adaptable.

12. The method according to claim 10, wherein said second trigger unit is capable of filtering the acquired signal according to the second trigger event in the acquired signal such that only those acquired signals are post-processed that fulfill the trigger condition of the zone trigger.

13. A signal processing device comprising:
a signal input for receiving an input signal;
a first trigger unit generating a trigger signal based upon a first trigger event in the input signal;
an acquisition memory for acquiring the input signal at least based upon the trigger signal so as to provide an acquired signal, the acquired signal being assigned to acquisition data stored in the acquisition memory;
a second trigger unit;
a post processing unit; and
a third trigger unit;
wherein the acquisition memory is located between the first trigger unit and the second trigger unit such that second trigger unit is located between the acquisition memory and the post processing unit, said second trigger unit having an input directly connected to an output of the acquisition memory, and an output of said second trigger unit directly connected to the post-processing unit, said second trigger unit being capable of receiving via its input the acquired signal on which the second trigger is applied such that the post-processing unit receives a pre-processed signal that is outputted by said second trigger unit via its output, said second trigger unit being adapted to process the acquired signal according to a second trigger, said second trigger unit being adapted as a zone trigger unit applying a zone trigger,
wherein no output from said second trigger unit is provided to the acquisition memory, said second trigger unit being configured to not affect the acquisition data stored in the acquisition memory, and wherein the acquired signal is filtered by the zone trigger applied by said second trigger unit such that only those acquired signals are post-processed that fulfill the trigger condition of the zone trigger,
wherein the acquired signal comprises signal tuples each having a first axis value and a second axis value, the first axis value being time or frequency, the second axis value being amplitude;
wherein the third trigger unit is located between the first trigger unit and the acquisition memory, the third trigger unit being also adapted as a zone trigger unit applying a zone trigger, wherein the zone trigger of the third trigger unit relates to a larger zone compared to the zone trigger applied by the second trigger unit such that a rough pre-filtering is applied so as to reduce the required storage capacity of the acquisition memory;
wherein a two-stage triggering is provided by the first trigger unit and the subsequent third trigger unit prior to the acquisition wherein the first trigger unit and the third trigger unit together provide a trigger signal that is forwarded to the acquisition memory for acquiring the input signal, and the post-processing unit being a measurement unit or an analysis unit.

\* \* \* \* \*